(12) United States Patent
Tong et al.

(10) Patent No.: US 11,493,535 B2
(45) Date of Patent: Nov. 8, 2022

(54) SYSTEMS AND METHODS FOR DEPOPULATING PINS FROM CONTACTOR TEST SOCKETS FOR PACKAGED SEMICONDUCTOR DEVICES

(71) Applicant: TEXAS INSTRUMENTS INCORPORATED, Dallas, TX (US)

(72) Inventors: Kay Chan Tong, Plano, TX (US); Hisashi Ata, Murphy, TX (US); Thiha Shwe, Murphy, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 113 days.

(21) Appl. No.: 16/718,057

(22) Filed: Dec. 17, 2019

(65) Prior Publication Data

US 2020/0141974 A1 May 7, 2020

Related U.S. Application Data

(62) Division of application No. 15/296,480, filed on Oct. 18, 2016, now Pat. No. 10,539,592.

(51) Int. Cl.
*G01R 31/00* (2006.01)
*G01R 1/04* (2006.01)
(Continued)

(52) U.S. Cl.
CPC ......... *G01R 1/0466* (2013.01); *G01R 1/0433* (2013.01); *G01R 1/0483* (2013.01);
(Continued)

(58) Field of Classification Search
CPC .. G01R 1/0408; G01R 1/0416; G01R 1/0433; G01R 1/0441; G01R 1/0466; G01R 1/07307; G01R 1/073; G01R 1/07314; G01R 1/07364; G01R 1/07371; G01R 31/2889; G01R 31/286; G01R 31/2863; G01R 1/0483; G01R 31/2886; H01R 13/514; H01R 31/02; H01R 12/89; H01R 13/20; H05K 7/1007; H05K 7/1069; H05K 7/1023; H01L 2924/00; H01L 2924/00014; H01L 2924/14
(Continued)

(56) References Cited

U.S. PATENT DOCUMENTS

| 4,730,159 A | 3/1988 | Collins |
| 4,774,462 A | 9/1988 | Black |

(Continued)

FOREIGN PATENT DOCUMENTS

JP 2012122972 A * 6/2012

*Primary Examiner* — Raul J Rios Russo
(74) *Attorney, Agent, or Firm* — Ronald O. Neerings; Charles A. Brill; Frank D. Cimino

(57) ABSTRACT

A reduced pin count (RPC) device includes an electrical circuitry in a package with uniformly distributed leads, a subset of the leads being electrically disconnected form the circuitry. A contactor pin block with sockets corresponding to the uniformly distributed leads has the sockets corresponding to the leads with electrical connections filled with test pins suitable for contacting respective leads, and the sockets corresponding to the electrically disconnected leads voided of test pins. Dummy plugs are inserted into the voided sockets to block the sockets and prevent accidental insertions of test pins.

20 Claims, 4 Drawing Sheets

(51) Int. Cl.
*G01R 31/28* (2006.01)
*G01R 1/073* (2006.01)

(52) U.S. Cl.
CPC ..... *G01R 1/07371* (2013.01); *G01R 31/2889* (2013.01); *G01R 31/286* (2013.01); *G01R 31/2863* (2013.01); *H01L 2924/00* (2013.01); *H01L 2924/00014* (2013.01); *H01L 2924/14* (2013.01)

(58) Field of Classification Search
USPC ......... 324/71, 378, 403, 415, 425, 500, 537, 324/756.01, 756.02
See application file for complete search history.

(56) References Cited

U.S. PATENT DOCUMENTS

| | | |
|---|---|---|
| 4,897,598 A | 1/1990 | Doemens et al. |
| 6,194,908 B1 | 2/2001 | Wheel et al. |
| 2003/0062541 A1* | 4/2003 | Warner ............... G06F 21/10 257/200 |
| 2017/0219631 A1* | 8/2017 | Montaque .......... G01R 1/07357 |
| 2018/0074118 A1* | 3/2018 | Worrall ................ H01L 23/345 |
| 2018/0106835 A1* | 4/2018 | Tong .................... G01R 1/0466 |
| 2020/0141974 A1* | 5/2020 | Tong .................... G01R 1/0466 |

* cited by examiner

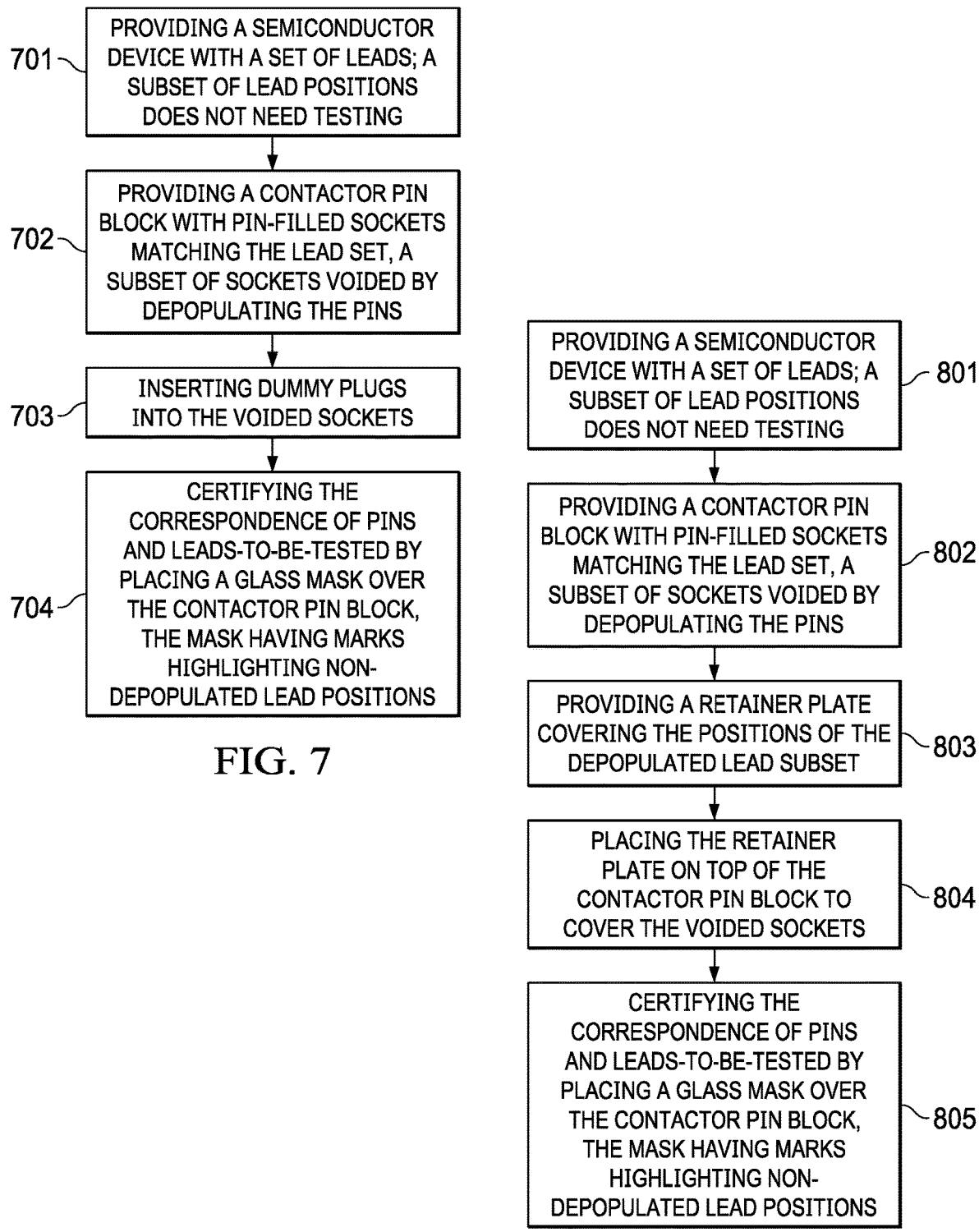

SYSTEMS AND METHODS FOR DEPOPULATING PINS FROM CONTACTOR TEST SOCKETS FOR PACKAGED SEMICONDUCTOR DEVICES

This application is a Divisional of application Ser. No. 15/296,480 filed Oct. 18, 2016 and which is incorporated herein by reference in its entirety.

FIELD

The present disclosure is related to the field of semiconductor devices and processes, and more specifically to structures and error-proof methods for testing packaged semiconductor devices.

DESCRIPTION OF RELATED ART

For testing a packaged semiconductor device, the leads of the package are conventionally fortified with easily contactable metallic contacts such as solder-coated leads or solder balls. These fortified leads are brought into contact with the pins of a pin block or a contactor. A mechanical force is needed to actualize the contact. The contacted lead can then be subjected to high-speed AC tests with power dissipation. The tests may be time consuming and thus expensive. For full pin count (FPC) devices, the number of leads may be as many as several hundreds, or even beyond one thousand. The high number of leads are typically arranged in an orderly pattern of rows and lines with equal spacing between the leads. For reduced pin count (RPC) devices, it is economical to exclude the redundant leads and pins from the testing process, since only a subset of the test may be required.

It has been observed in RCP devices that erroneous test results such as an electrical open, no contact, or short may be indicated when a pin is incorrectly placed in the pin block. In these cases, the missing pin, or surplus pin, may be interpreted as open or short leads, resulting in a failure and rejection of the device. A pin test indicating missing continuity results in site failure and thus yield loss. The failure is flagged by online automation and requires process control to address and correct the problem. When such non-continuity happens in power or ground connections, the loss may not be immediately evident and may not trigger site-to-site checks in online automation. Rather the loss may lead to subtle or marginal yield loss. Such loss is difficult to isolate or may sometimes delay a detection and corrective action due to intensive debug work. These delayed responses may result in revenue loss from yield loss; they may also cause delayed failure in life or performance tests and thus potentially affect product qualification.

Applicants solved the problem of subtle yield loss in testing semiconductor devices caused by misconfigured contactor pin blocks for reduced pin count (RPC) devices, when they discovered error-proof methodologies for configuring RCP contactor pin blocks. These methods have the advantage that they are flexible and applicable for a variety of RPC devices, use low cost procedures, and may be applied individually of in conjunction with each other.

While full lead count (FPC) devices have a full lead set in regular positions of an array of rows and columns and each lead needs testing, RPC semiconductor devices include a subset of lead positions, which do not have to undergo certain tests and therefore do not have to receive the mechanical force needed to establish an electrical contact. The RPC contactors dedicated to these devices have pogo pins in sockets matching the lead set reduced by the subset. The RPC contactors may be created either by starting with a full set of pin population and then manually depopulating the pins from the sockets corresponding to the lead subset, or by not loading the pins into the sockets corresponding to the lead subset in the first place. By either method, the contactor will include voided sockets.

An embodiment of the disclosure inserts dummy plugs into the voided sockets and thus prevents accidental re-insertions of unwanted pins into the sockets.

Another embodiment of the disclosure places a retainer plate on top of the contactor pin block to cover the voided sockets of the depopulated subset.

Yet another embodiment certifies the one-to-one correspondence of pins and leads-to-be-tested by placing a glass mask over the tester pin block, wherein the mask includes marks, such as printed donut rings, which highlight lead positions requiring testing.

BRIEF DESCRIPTION OF THE DRAWINGS

FIG. 7 is a diagram of the process flow for filling voided sockets of an RPC contactor for testing a semiconductor device according to the disclosure.

FIG. 8 is a diagram of the process flow for placing a retainer plate over voided sockets of an RPC contactor for testing a semiconductor device according to the disclosure.

DETAILED DESCRIPTION OF THE PREFERRED EMBODIMENTS

Figure 1:
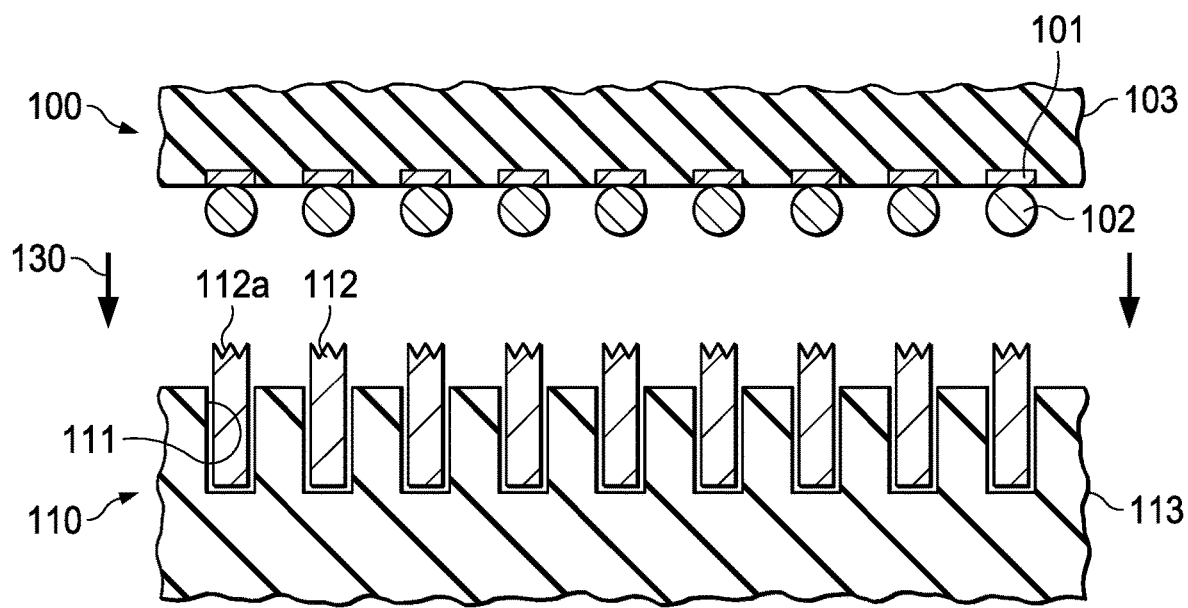
FIG. 1 illustrates a cross section of a portion of a semiconductor device package aligned with a portion of the corresponding contactor pin block; both leads and pins exhibit FPC (full pin count).

FIG. 1 illustrates a cross section of a portion of an exemplary package 100 of a semiconductor device, which includes a set of metallic leads 101 for electrical contacts to external conductive circuit elements. The exemplary package may be constructed of a polymeric material 103 such as the polymerized epoxy-based molding compound of plastic packages. In the exemplary package 100, leads 101 are uniformly distributed in an array of rows and columns. Such semiconductor packages are used, for instance, in semiconductor ball grid array (BGA) devices, pin grid array devices, leadless grid array (LGA) devices, and QFN (Quad Flat No-Lead) devices. Other semiconductor packages may be configured with cantilevered leads, preferably solder-wettable leads.

The flat leads of the exemplary device of FIG. 1 include facilitators for reliable electrical contact, and these facilitators can be solder balls 102. Balls or bumps made of solder offer the advantage of being pliable enough to form reliable contacts to the small teeth or cogs, which are commonly configured on the crown tip of tester pins. In FIG. 1, each lead 101 is populated by a solder ball 102.

FIG. 1 shows a portion of contactor pin block 110 designed for testing device package 100. Pin block 110 may be made of an insulating material 113 such as hardened plastic. The contactor pin block includes a plurality of sockets 111 in uniformly distributed positions matching the set of leads 101 arrayed in rows and columns. Consequently, contactor sockets 111 match with respective leads 101 on a one-to-one basis.

Sockets 111 are designed as cavities to hold test pins 112 tightly. The test pins 112 are shaped as elongated cylinders made of hardened metal such as stainless steel, palladium alloy, or metal plated with nickel, palladium, or gold. The test pins 112 may have a length of about 3 mm and a diameter of approximately 0.3 mm. The test pins 112 can be referred to as pogo pins. Test pins 112 are configured to have crown tips with small teeth or cogs 112a for providing reliable electrical contact to leads 101 or solder balls 102. The number of teeth or points 112a for some pogo pins 112 may vary from 3 to 6. As FIG. 1 shows, each socket 111 is populated by a pogo pin 112, indicating that each pogo pin is available to, and involved in, testing the respective lead 101 or solder ball 102 of device package 100. Contactors as shown in FIG. 1 are referred to as full pin count (FPC) test contactors.

In order to initiate the testing process, packaged device 100 is aligned with contactor pin block 110; thereafter, packaged device 100 is moved to bring it in contact with the pogo pins of pin block 110. The movement of device 100 is indicated by arrows 130 in FIG. 1. A mechanical force is applied to assure reliable electrical contact.

Figure 2:
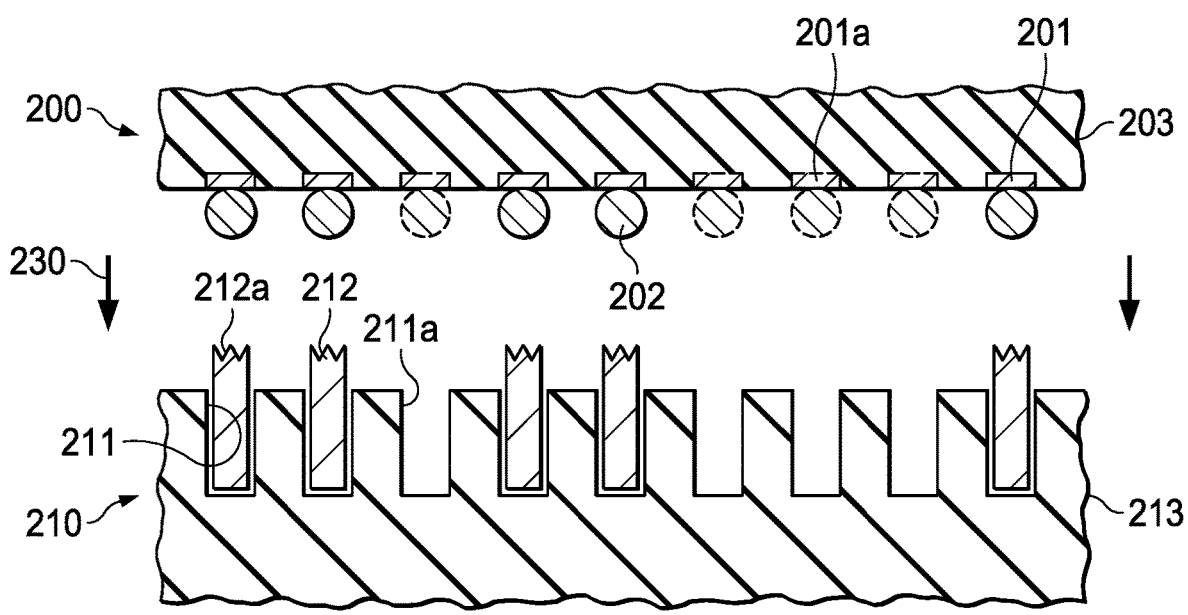
FIG. 2 shows a cross section of a portion of a semiconductor device package aligned with a portion of the corresponding contactor pin block. The device includes a subset of leads not in need of testing. The voided sockets of the contactor correspond to the device leads not needing testing, the pins in the loaded sockets correspond to the RPC (reduced pin count).

FIG. 2 depicts a portion 200 of an exemplary semiconductor package for a device, where not all contacts need connection for electrical tests; such devices are commonly referred to as having reduced pin count (RPC). The package made of plastic material 203 exhibits the full set of metallic leads 201, uniformly distributed in an array of rows and columns. This set, however, includes a subset of leads 201a, which occupy a position in the layout of the array, but are electrically not connected to the circuitry of the particular device in the package. In FIG. 2, leads of this subset are marked by dashed outline for clarity purposes. The inactive leads 201a of this subset carry solder balls, also marked by dashed outline in FIG. 2. Alternatively, in some devices leads of this subset may not include solder balls 202; or, in other devices, may not even include the lead metallization in the spaces reserved for leads in the package. The leads of the subset are sometimes referred to as being "depopulated" of solder balls, or leads respectively.

FIG. 2 shows the portion 210 of a contactor pin block designed for testing device package 200. Contactor pin block 210 may be made of an insulating material 213 such as hardened plastic. The pin block includes a plurality of sockets 211 in uniformly distributed positions matching the set of leads 201 arrayed in rows and columns. Consequently, sockets 211 match with respective leads 201 on a one-to-one basis.

Sockets 211 are designed as cavities to hold test pins 212 tightly. Test pins 212 are configured as elongated cylinders of about 3 mm length and about 0.3 mm diameter. Test pins 212 are made of hardened metal such as stainless steel or palladium alloy with crown tips having small teeth or cogs 212a for providing reliable electrical contact to leads 201 or solder balls 202. Test pins 212 can be referred to as pogo pins.

The present disclosure introduces methods for providing the correct number of pins of the contactor block for reduced pin count (RPC) devices as shown in the example of FIG. 2. In one method, for example, the contactor pin block (e.g., 210) can be populated by a pogo pin 212 in each socket 211 as if all leads 201 of package 200 are tested. The pins corresponding to the subset of electrically inactive leads are then removed manually from the sockets. This action creates the voided sockets 211a as shown in FIG. 2. In another method, for example, the contactor block (e.g., 210) is originally manufactured to create the voided sockets 211a; consequently, the finished contactor block exhibits the voided sockets corresponding to the reduced pin count (RPC) device.

With the contact block having pins only in the sockets corresponding to the RPC device, the testing process can proceed. Packaged device 200 is aligned with pin block 210; thereafter, packaged device 200 is moved to bring it in contact with the pogo pins 112 of pin block 210. The movement including a mechanical force is indicated by arrows 230 in FIG. 2.

Figure 3:
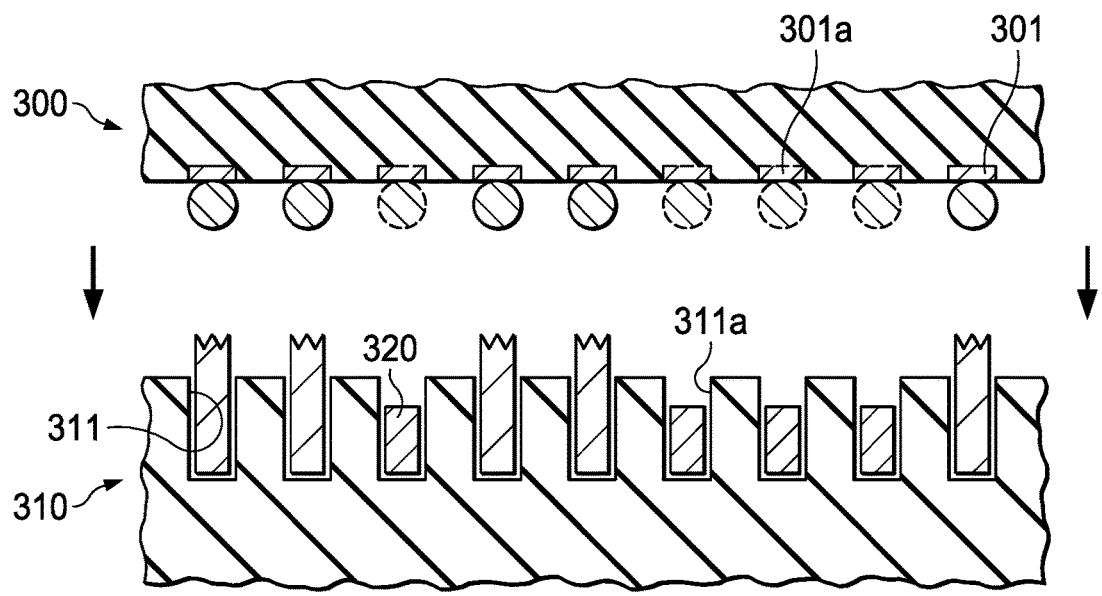
FIG. 3 depicts a cross section of a portion of a semiconductor device package aligned with a portion of the corresponding contactor pin block; the pins in the loaded sockets exhibit RPC (reduced pin count). Dummy plugs have been inserted into the voided test sockets according to an embodiment of the disclosure.

FIG. 3 illustrates an embodiment of the present disclosure. Dummy plugs 320 are inserted into the voided sockets 311a in order to block the sockets and prevent accidental re-insertions of unwanted test pins. Dummy plugs 320 thus enable error proof accuracy and efficiency of the testing process. As mentioned above, the erroneous insertion of test pins would result in tests faking electrical opens or shorts. FIG. 3 shows the finished pin block 310 after filling the voided sockets 311a with dummy plugs 320. Dummy plugs 320 may be made of portions of pogo pins or of other suitable small cylinders of durable metal alloy. As a consequence, the dummy plugs alleviate maintenance, because only exposed unplugged sockets need test pin replacement or test pin rebuilding. On the other hand, dummy plugs facilitate re-configuration of the pin block for other devices with different RPC configurations.

Figure 4:
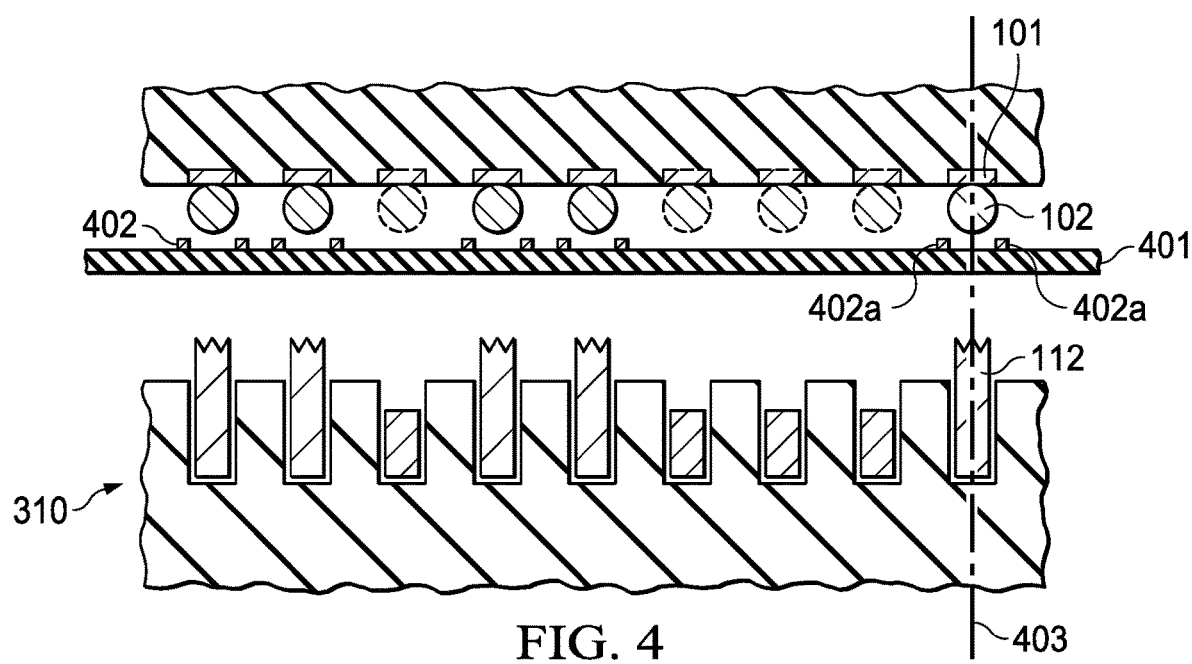
FIG. 4 illustrates a cross section of the contactor and aligned device-to-be-tested of FIG. 3; a transparent plate is inserted, which has marks identifying exclusively the pins needed for testing.

As illustrated in FIG. 4, the insertion of dummy plugs into voided sockets can be corroborated by a process of placing a transparent mask 401 over the pin block 310. A preferred transparent material is glass; alternatively, a clear plastic may be used. Glass mask 401 has been prepared by printing marks 402 on the glass surface, which highlight the positions matching the electrically active and populated leads in uniformly distributed positions of rows and columns. A preferred configuration of the marks are donut-shaped marks. The marks are indicating the locations where a test by test pins is needed. An example of such donut-shaped mark is depicted in FIG. 4 by the marks 402a, which surround the center line 403 through the respective lead 101, the solder ball 102, the donut 402a, and the respective test pin 112.

All donut-shaped marks allow the viewing of the test pins under the glass; in contrast, a blank is visible where no test pin is positioned. The marks are certifying the one-to-one correspondence of leads-to-be-tested and test-pin-filled sockets, and are therefore confirming that the test pin population is accurately representing the RPC pattern. A test pin missing in the donut indicates that a needed test pin is not in place, and, in contrast, a test pin appearing in the blank glass area indicates that a test pin has been misplaced.

The process flow summarizing the above method is displayed in FIG. 7. In process 701 (illustrated in FIG. 2), a semiconductor device 200 is provided, which has a set of leads including a subset of lead positions 201a which does not need testing. In process 702 (illustrated in FIG. 1), a contactor pin block 110 is provided, which has sockets 111 matching the lead set. The sockets are filled with test pins 112 except for a subset of sockets 211a, which is voided by depopulating the test pins.

Next, in process 703 (illustrated in FIG. 3), dummy plugs 320 are inserted into the voided sockets 311a. While the method may be stopped after this process, it is preferred to continue the process flow with process control step 704. This process certifies the correspondence of pins and leads-to-be-tested. In this process step (illustrated in FIG. 4), a glass mask 401 is placed over the contactor pin block. The mask has marks 402a highlighting test pins 112 in lead positions needing testing, which correspond to leads-to-be-tested 101 with solder balls 102. A test pin missing in the donut would indicate that a needed test pin is not in place, and, in contrast, a test pin appearing in the blank glass area would indicate that a test pin has been misplaced.

Figure 5:
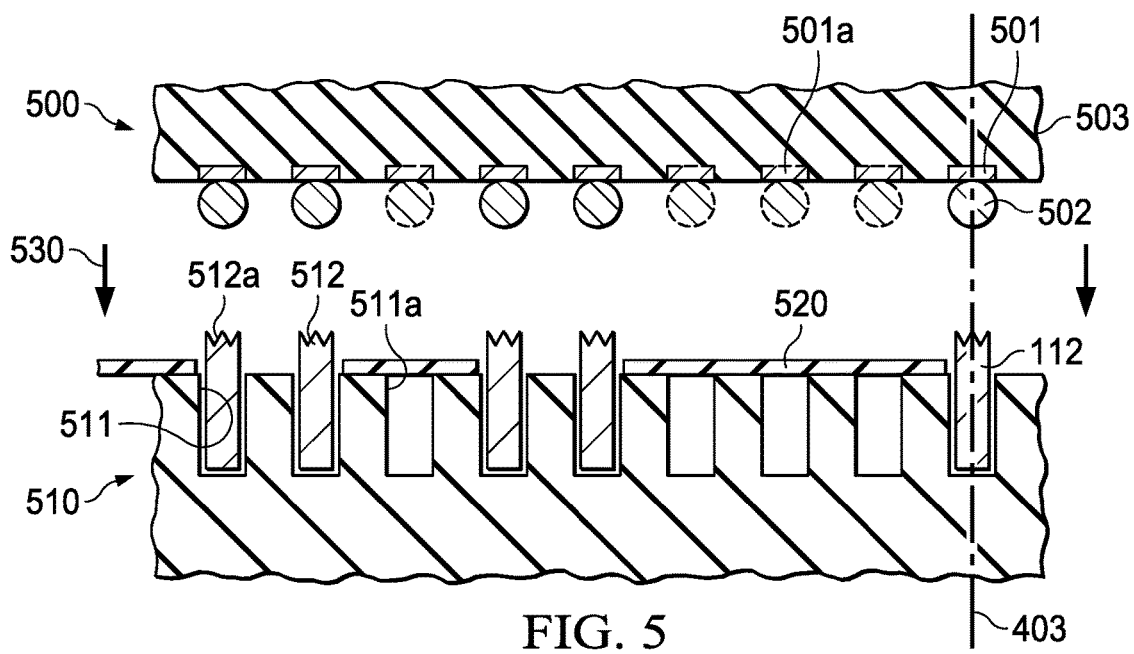
FIG. 5 shows a cross section of a portion of a semiconductor device package aligned with a portion of the corresponding contactor pin block; the pins on the loaded sockets exhibit RPC. A matching retainer plate has been placed on top of the contactor pin block, the plate covering voided sockets according to an embodiment of the disclosure.

Another embodiment of the disclosure is displayed in FIG. 5, which illustrates a portion 500 of an exemplary semiconductor package for a device, where not all contacts need connection for electrical tests; such devices are commonly referred to as having reduced pin count (RPC). The package made of plastic material 503 exhibits a full set of metallic leads 501, uniformly distributed in an array of rows and columns. This set, however, includes a subset of leads 501a, which occupy a position in the layout of the array, but are electrically not connected to the circuitry of the particular device in the package. In FIG. 5, leads of this subset are marked by dashed outline for clarity purposes. The inactive leads 501a of this subset carry solder balls also marked by dashed outline. The leads of the subset are sometimes referred to as being "depopulated" of solder balls, or leads respectively.

FIG. 5 shows the portion 510 of a contactor pin block designed for testing device package 500. Contactor pin block 510 may be made of an insulating material 513 such as hardened plastic. The pin block includes a plurality of sockets 511 in uniformly distributed positions matching the set of leads 501 arrayed in rows and columns. Consequently, sockets 511 match with respective leads 501 on a one-to-one basis.

Sockets 511 are designed as cavities to hold test pins 512, which are configured as elongated cylinders of about 3 mm length and about 0.3 mm diameter. Test pins 512 are made of hardened metal such as stainless steel or palladium alloy with crown tips having small teeth or cogs 512a for providing reliable electrical contact to leads 501 or solder balls 502.

Contactor 510 includes voided sockets 511a, since exemplary device 500 of FIG. 5 is a RPC device. In RPC devices, leads 501a occupy a position in the layout of the array, but are electrically not connected to the circuitry of the particular device in the package. Leads 501a do not need testing. Sockets 511a voided of test pins match the positions of the inactive leads. For the testing process, packaged device 500 is aligned with contactor pin block 510, and packaged device 500 is moved to bring it in contact with the test pins of pin block 510. The movement of indicated by arrows 530.

A retainer plate 520 is provided, which covers the positions matching the subset of electrically inactive leads 501a, and has openings in the positions matching the remainder of the set of leads 501. The retainer plate may, for instance, be made of a sheet of plastic. Alternatively, the bottom plate of the test pins of a contactor may be transformed into a retainer plate with the customized RPC voided sockets.

As illustrated in FIG. 5, after the retainer plate 520 is placed on top the contactor pin block 510 to cover the voided sockets 511a of the subset locations, the retainer plate 520 can prevent accidental re-insertions of unwanted pins. On the other hand, the retainer plate allows uninhibited functioning of test pins 512 in the sockets, which are needed for the RPC device. Retainer plate 520 thus enables error proof accuracy and efficiency of the tests. As mentioned above, the erroneous insertion of pins would result in tests faking electrical opens or shorts. As a consequence, the retainer plate alleviates maintenance, because only exposed unplugged sockets need test pin replacement or test pin rebuilding. On the other hand, using a new retainer plate for a new RPC configuration facilitates re-configuration of the pin block for other devices with this different RPC configuration.

Figure 6:
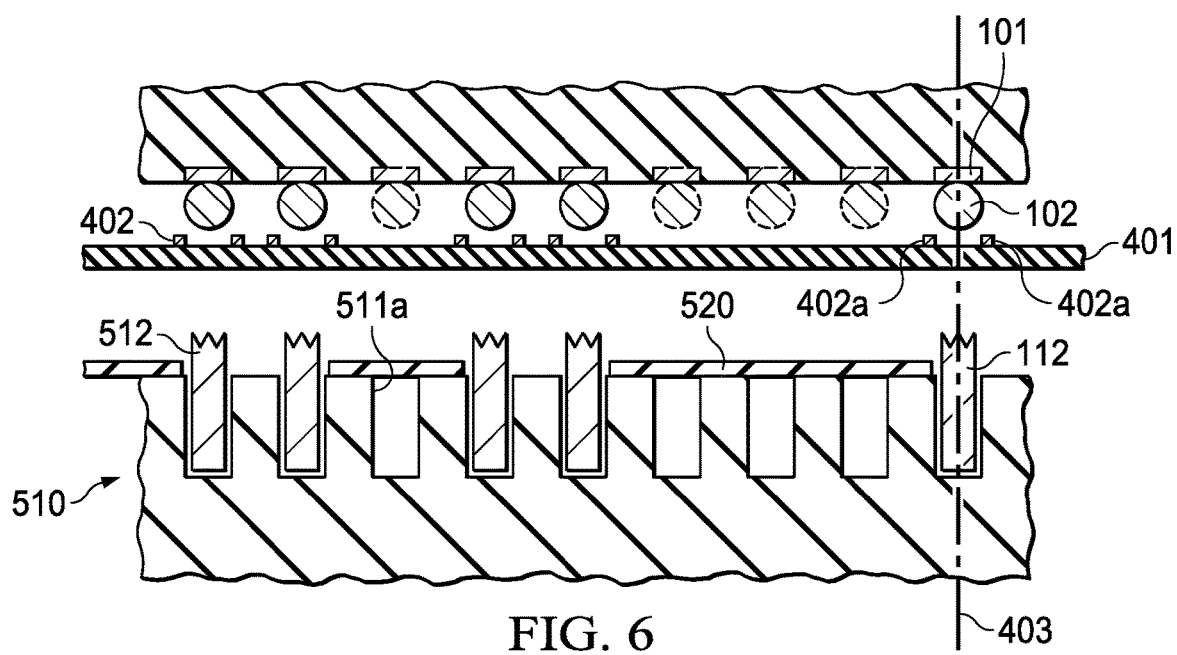
FIG. 6 depicts a cross section of the contactor and aligned device-to-be-tested of FIG. 5; a transparent plate is inserted, which has marks identifying exclusively the pins needed for testing.

As illustrated in FIG. 6, the success of using a retainer plate 520 over voided sockets 511a can be corroborated by a process of placing a transparent mask 401 over the contactor pin block. A preferred transparent material is glass; alternatively, a clear plastic may be used. Glass mask 401 has been prepared by printing donut-shaped marks 402 on the glass surface, which highlight the positions matching the electrically active and populated leads in uniformly distributed positions of rows and columns. The marks are indicating the locations where a test by test pins is needed. An example of such donut-shaped mark is depicted in FIG. 4 by the marks 402a, which surround the center line 403 through the respective lead 101, the solder ball 102, the donut 402a, and the respective test pin 112.

The donut-shaped marks allow the viewing of the test pins under the glass; in contrast, a blank is visible where the retainer plate 520 is positioned. The marks are certifying the one-to-one correspondence of leads-to-be-tested and pin-filled sockets, and are therefore confirming that the test pin population is accurately representing the RPC pattern. A retainer plate in the donut indicates that a needed pin is not in place, and, in contrast, a pin appearing in the blank glass area indicates that a pin has been misplaced.

The process flow summarizing the above method is displayed in FIG. 8. In process 801 (illustrated in FIG. 2), a semiconductor device 200 is provided, which has a set of leads including a subset of lead positions 201a which does not need testing. In process 802 (illustrated in FIG. 1), a contactor pin block 110 is provided, which has sockets 111 matching the lead set; each socket is filled with a test pin 112 except for a subset of sockets 211a, which is voided by depopulating the test pins.

Next, in process 803 (illustrated in FIG. 5), a retainer plate 520 is provided, which covers the positions of the depopulated lead subset. Then, in process 804, the retainer plate is placed on top of the contactor pin block to cover the voided sockets 511a. While the method may be stopped here, it is preferred to continue the process flow with process control step 805. This process certifies the correspondence of test pins and leads-to-be-tested. In this process step (illustrated in FIG. 6), a glass mask 401 is placed over the contactor pin block. The mask has marks 402a highlighting test pins 112 in lead positions needing testing, which correspond to leads-to-be-tested 101 with solder balls 102. A pin missing in the donut would indicate that a needed test pin is not in place.

While this disclosure has been described in reference to illustrative embodiments, this description is not intended to be construed in a limiting sense. Various modifications and combinations of the illustrative embodiments, as well as other embodiments of the disclosure, will be apparent to persons skilled in the art upon reference to the description. As an example, the disclosure applies to products using any type of semiconductor chip, discrete or integrated circuit, and the material of the semiconductor chip may comprise silicon, silicon germanium, gallium arsenide, gallium nitride, or any other semiconductor or compound material used in integrated circuit manufacturing.

As another example, the disclosure applies not only to flat leads of semiconductor packages, but also to leads configured as cantilevers or pins. As yet another example, the disclosure applies also to package-free semiconductor chips with contact areas.

We claim:

1. A method, comprising:
   providing a semiconductor device including a circuitry in a package, the package having leads, a first subset of the leads being electrically disconnected from the circuitry, a second subset of the leads having electrical connections to the circuitry;
   providing a contactor pin block having sockets corresponding to the leads, a first subset of the sockets corresponding to the first subset of the leads without being filled with test pins, a second subset of the sockets filled with test pins for contacting the second subset of leads; and
   inserting dummy plugs into the first subset of the sockets.

2. The method of claim 1, further comprising:
   placing a transparent mask over the contactor pin block, the mask having marks highlighting the positions of the first subset of the sockets corresponding to the first subset of the leads.

3. The method of claim 2, wherein the marks each having a donut shape.

4. The method of claim 1, wherein the first subset of the leads are attached with solder balls.

5. The method of claim 1, further comprising:
   aligning the leads with the corresponding sockets of the contactor pin block;
   contacting the first subset of the leads with the corresponding test pins; and
   initiating a testing process associated with the first subset of the leads while blocking the second subset of the leads from accessing the testing process.

6. A contactor pin block, comprising:
   an insulating body having sockets corresponding to leads of a package of a semiconductor device including a circuitry, wherein a first subset of the leads being electrically connectable to the circuitry, a second subset of the leads being not electrically connectable to the circuitry;
   test pins populating a first subset of the sockets corresponding to the first subset of the leads; and
   dummy plugs populating a second subset of the sockets corresponding to the second subset of the leads, the dummy plugs not extending beyond any exterior surface of the contactor pin block.

7. A method, comprising:
   providing a semiconductor device with a set of leads;
   providing a contactor pin block with pin-filled sockets matching the set of leads;
   voiding a subset of the sockets by depopulating selected pins in the voided sockets;
   inserting dummy plugs into the voided sockets.

8. The method of claim 7, further comprising:
   placing a transparent mask over the contactor pin block, the mask having marks highlighting the positions of the dummy plugs.

9. The method of claim 8, wherein the marks each having a donut shape.

10. The method of claim 7, wherein the leads are attached with solder balls.

11. The method of claim 7, further comprising aligning the leads with the corresponding sockets of the contactor pin block.

12. The method of claim 11, further comprising contacting the leads with the corresponding test pins.

13. The method of claim 12, further comprising initiating a testing process associated with the leads opposite the pin-filled sockets.

14. The method of claim 8, further comprising aligning the leads with the corresponding sockets of the contactor pin block.

15. The method of claim 14, further comprising contacting the leads with the corresponding test pins.

16. The method of claim 15, further comprising initiating a testing process associated with the leads opposite the pin-filled sockets.

17. The method of claim 7, further comprising blocking the leads opposite the dummy plug-filled sockets from accessing the testing process.

18. The method of claim 11, further comprising blocking the leads opposite the dummy plug-filled sockets from accessing the testing process.

19. The method of claim 1, wherein the dummy plugs do not extending beyond any exterior surface of the contactor pin block.

20. The method of claim 1, wherein the dummy plugs do not extending beyond any exterior surface of the contactor pin block.

* * * * *